United States Patent
Koshihara

(10) Patent No.: US 9,991,472 B2
(45) Date of Patent: Jun. 5, 2018

(54) ELECTRO-OPTICAL APPARATUS, MANUFACTURING METHOD THEREOF, AND ELECTRONIC DEVICE

(71) Applicant: SEIKO EPSON CORPORATION, Tokyo (JP)

(72) Inventor: Takeshi Koshihara, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days. days.

(21) Appl. No.: 15/497,654

(22) Filed: Apr. 26, 2017

(65) Prior Publication Data
US 2017/0229677 A1 Aug. 10, 2017

Related U.S. Application Data

(62) Division of application No. 14/958,028, filed on Dec. 3, 2015, now Pat. No. 9,673,416.

(30) Foreign Application Priority Data

Dec. 25, 2014 (JP) .................................. 2014-262959

(51) Int. Cl.
*H01L 51/52* (2006.01)
*H01L 51/56* (2006.01)
(Continued)

(52) U.S. Cl.
CPC ...... *H01L 51/5265* (2013.01); *H01L 27/3211* (2013.01); *H01L 27/3276* (2013.01);
(Continued)

(58) Field of Classification Search
CPC . H01L 51/5203; H01L 51/5253; H01L 51/56; H01L 51/0024; H01L 27/3236;
(Continued)

(56) References Cited

U.S. PATENT DOCUMENTS 6,184,960 B1 2/2001 Sawayama et al.
2005/0200270 A1 9/2005 Kwak et al.
(Continued)

FOREIGN PATENT DOCUMENTS

JP H06-308529 A 11/1994
JP H11-249127 A 9/1999
(Continued)

OTHER PUBLICATIONS

Nov. 1, 2016 Office Action Issued in U.S. Appl. No. 14/958,028.

*Primary Examiner* — Tucker J Wright
(74) *Attorney, Agent, or Firm* — Oliff PLC

(57) ABSTRACT

There is provided an electro-optical apparatus including an element substrate that includes a display region in which a plurality of light-emitting elements are arranged, and a peripheral region in which a terminal is disposed. The light-emitting element has a structure in which a reflective electrode, an optical adjustment layer, a first electrode, a light-emitting layer, and a second electrode are laminated, and the first electrode is electrically connected to a contact electrode. The terminal has a structure in which a first terminal layer that is formed by a first conductive film which is the same as the reflective electrode, a second terminal layer that is formed by a second conductive film which is the same as the contact electrode, and a third terminal layer that is formed by a third conductive film which is the same as the first electrode are laminated.

3 Claims, 12 Drawing Sheets

(51) Int. Cl.
  *H01L 51/00* (2006.01)
  *H01L 27/32* (2006.01)
(52) U.S. Cl.
  CPC ...... *H01L 51/0023* (2013.01); *H01L 51/5203* (2013.01); *H01L 51/5218* (2013.01); *H01L 51/56* (2013.01); *H01L 2227/323* (2013.01); *H01L 2251/301* (2013.01); *H01L 2251/308* (2013.01)
(58) Field of Classification Search
  CPC ......... H01L 27/3244; H01L 2251/5315; H01L 51/526556
  See application file for complete search history.

(56) References Cited

U.S. PATENT DOCUMENTS

| | | |
|---|---|---|
| 2011/0298391 A1 | 12/2011 | Kwak et al. |
| 2013/0056714 A1 | 3/2013 | Hasegawa et al. |

FOREIGN PATENT DOCUMENTS

| | | |
|---|---|---|
| JP | 2000-206568 A | 7/2000 |
| JP | 2003-216064 A | 7/2003 |
| JP | 2005-258395 A | 9/2005 |
| JP | 2008-041277 A | 2/2008 |
| JP | 2010-198754 A | 9/2010 |
| JP | 2011-187459 A | 9/2011 |

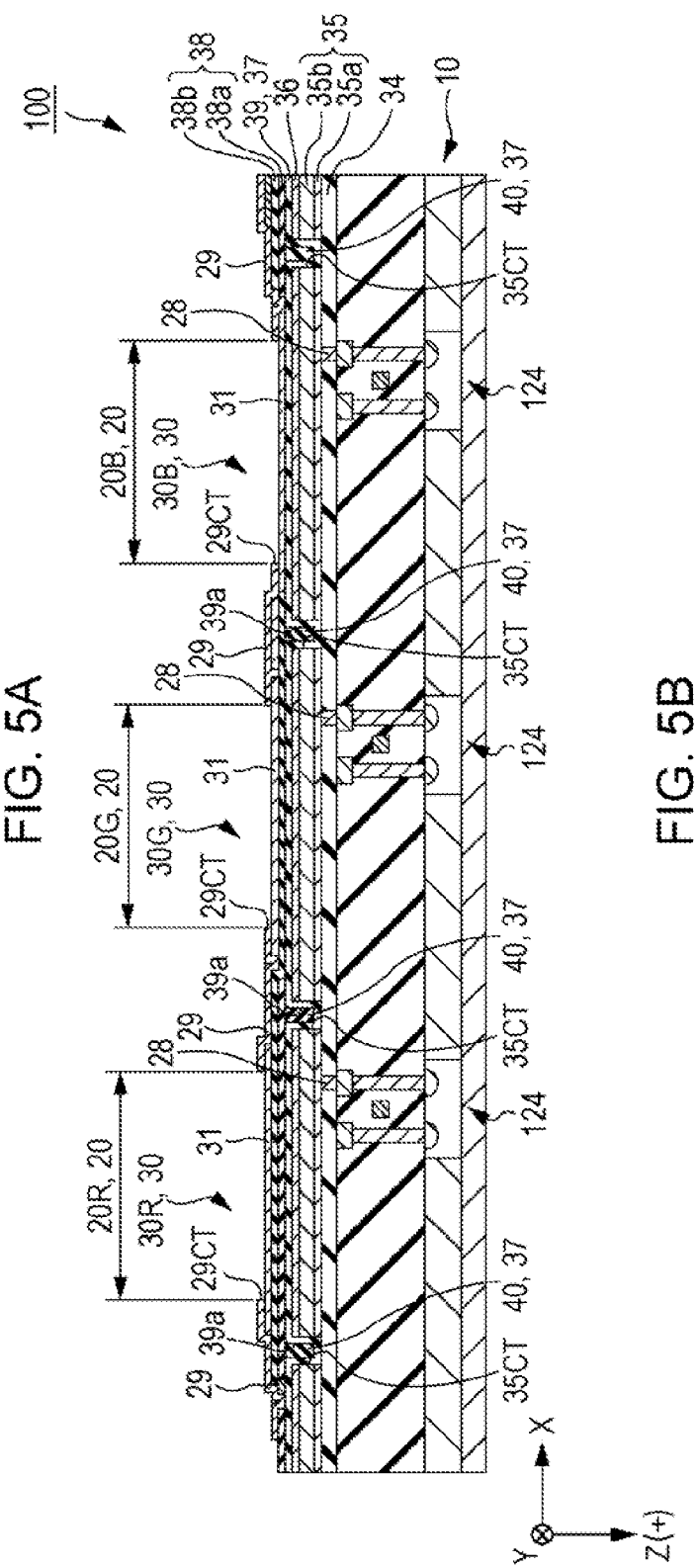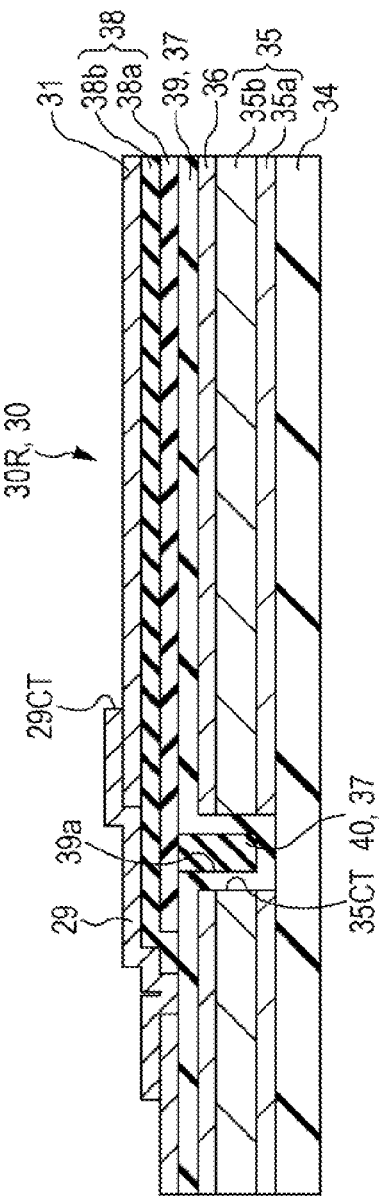

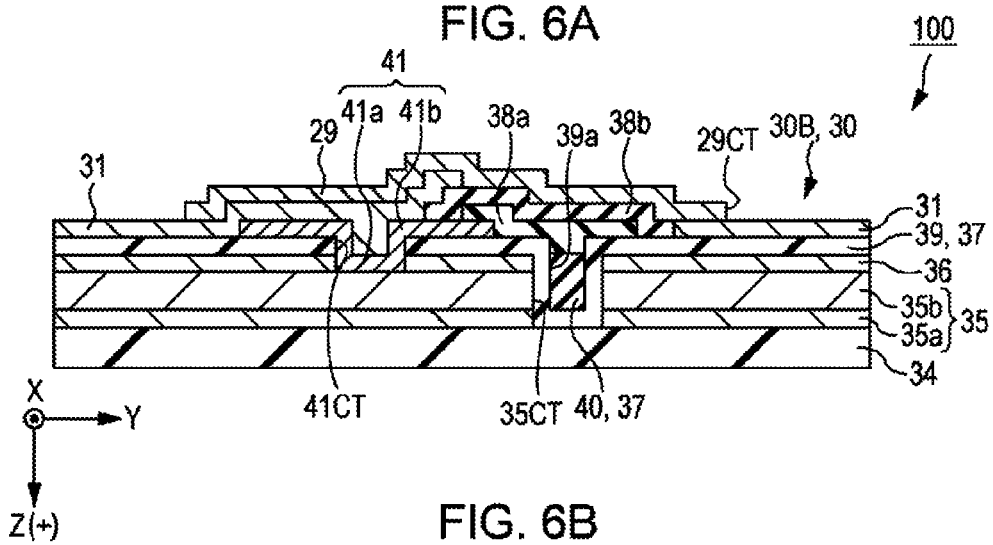
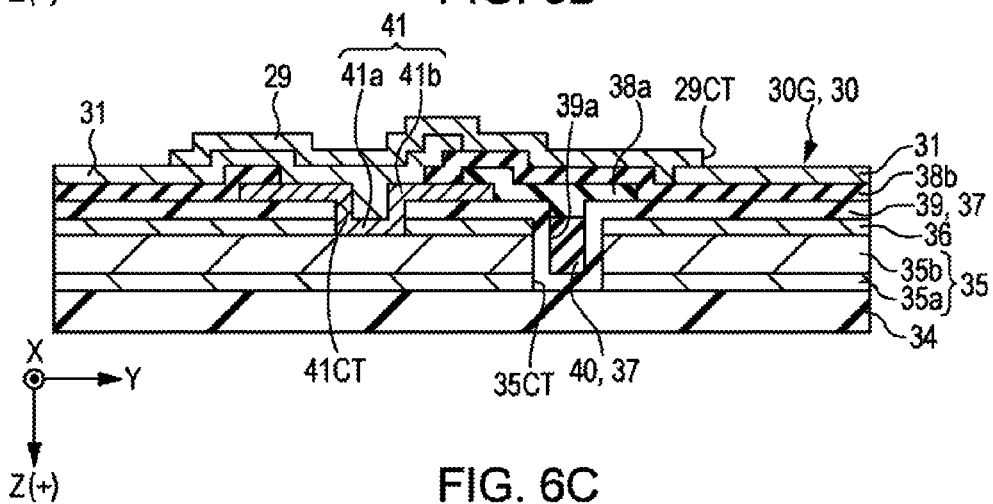
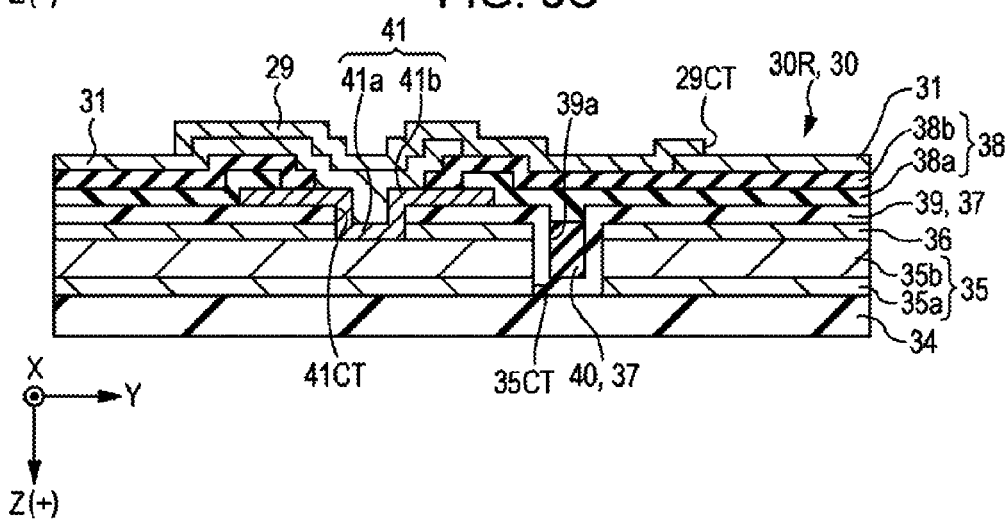

ELECTRO-OPTICAL APPARATUS, MANUFACTURING METHOD THEREOF, AND ELECTRONIC DEVICE

CROSS-REFERENCE TO RELATED APPLICATIONS

This is a Division of application Ser. No. 14/958,028 filed Dec. 3, 2015, which claims priority to Japanese Patent Application JP 2014-262959, filed Dec. 25, 2014. The disclosure of the prior application[s] is hereby incorporated by reference herein in its entirety.

BACKGROUND

1. Technical Field

The present invention relates to an electro-optical apparatus, a manufacturing method thereof, and an electronic device.

2. Related Art

An organic electro luminescence (EL) apparatus, in which pixels that use an organic EL element are disposed in a matrix form in a display region of an element substrate, is proposed as an example of the electro-optical apparatus (for example, refer to JP-A-2010-198754).

In detail, JP-A-2010-198754 discloses a top emission structure organic EL apparatus that has an organic EL element in which a reflective layer, a first electrode (pixel electrode), a light-emitting layer, and a second electrode (counter electrode) are laminated in that order.

Here, in the organic EL apparatus described in JP-A-2010-198754, a plurality of terminals, which include a mounting terminal for mounting a data line driving circuit, a scanning line driving circuit, and the like, an external connection terminal, and the like, are arranged in a peripheral region outside the display region. The terminals have a structure in which a reflective conductive material such as aluminum (Al) that forms a film by the same process as the reflective layer which is described above, and a transparent conductive material such as indium tin oxide (ITO) that forms a film by the same process as the first electrode are laminated.

However, in a case where the reflective conductive material and the transparent conductive material which are described above are directly laminated, a contact resistance in the terminals is very high. In addition, there are times when electrolytic corrosion occurs between the reflective conductive material and the transparent conductive material. As a countermeasure, manufacturing the terminals using another processes is considered, but manufacturing costs rise due to an increase in the number of processes.

Meanwhile, JP-A-2010-198754 discloses a terminal in which ITO is laminated on a wiring layer on which titanium (or titanium nitride), aluminum, and titanium (or titanium nitride) are laminated. However, in a case where the same material as the wiring layer is used in the reflective layer, there is a concern that reflectivity of the reflective layer is reduced.

SUMMARY

An advantage of some aspects of the invention is to provide an electro-optical apparatus which is able to reduce a resistance value of a terminal while preventing a reduction of reflectivity of the reflective electrode, a manufacturing method thereof, and an electronic device provided with such an electro-optical apparatus.

An electro-optical apparatus according to an aspect of the invention includes an element substrate that includes a display region in which a plurality of light-emitting elements are arranged in a matrix form, and a peripheral region in which a terminal is disposed outside the display region. The light-emitting element has a structure in which a reflective electrode, an optical adjustment layer, a first electrode, a light-emitting layer, and a second electrode are laminated, and the first electrode is electrically connected to a contact electrode. The terminal has a structure in which a first terminal layer that is formed by a first conductive film which is in a same layer as the reflective electrode, a second terminal layer that is formed by a second conductive film which is in a same layer as the contact electrode, and a third terminal layer that is formed by a third conductive film which is in a same layer as the first electrode are laminated.

According to this configuration, in the terminal, it is possible to reduce the resistance value of the terminal while preventing a reduction of reflectivity of the reflective electrode by providing the second terminal layer that is formed by the second conductive film which is the same as the contact electrode between the first terminal layer that is formed by the first conductive film which is the same as the reflective electrode and the third terminal layer that is formed by the third conductive film which is the same as the first electrode.

In addition, the electro-optical apparatus may have a configuration in which the third conductive film includes a transparent conductive material, the second conductive film includes a conductive material with a higher conductivity than the third conductive film, and the first conductive film includes a reflective conductive material.

According to this configuration, in the terminal, it is possible to further reduce the resistance value of the terminal than the case in which the reflective conductive material and the transparent conductive material are directly laminated by providing the second conductive film that includes a conductive material with a higher conductivity than the third conductive film between the first conductive film that includes a reflective conductive material and the third conductive film that includes a transparent conductive material. In addition, since the reflective electrode is formed by the first conductive film which includes a reflective conductive material, it is possible to prevent a reduction in reflectivity of the reflective electrode.

In addition, the electro-optical apparatus may have a configuration in which the third conductive film includes indium tin oxide, the second conductive film includes titanium nitride, and the first conductive film includes aluminum and copper.

According to this configuration, in the terminal, it is possible to reduce a resistance value of the terminal by providing the second conductive film which contains titanium nitride between the first conductive film which includes aluminum and copper and the third conductive film which includes indium tin oxide. In addition, since the reflective electrode is formed using the first conductive film which includes aluminum and copper, it is possible to prevent a reduction in reflectivity of the reflective electrode.

In addition, the electro-optical apparatus may have a configuration in which the first electrode is electrically connected to the reflective electrode via a contact electrode, and the reflective electrode is electrically connected to a transistor which drives the light-emitting element.

According to this configuration, since the transistor and the first electrode are electrically connected via the reflective electrode, the reflective electrode and the first electrode have the same potential. Thereby, it is possible to perform the light-emitting operation of the light-emitting element with high reliability while controlling the potential which is applied from the transistor to the first electrode via the reflective electrode. In addition, according to this configuration, it is possible to achieve a further improvement in yield.

In addition, the electro-optical apparatus may have a configuration in which the reflective electrode is configured by a portion of a power supply line, a relay electrode which is electrically connected to a transistor that drives the light-emitting element is disposed inside an opening which is formed in the reflective electrode, and the first electrode is electrically connected to the relay electrode via the contact electrode.

According to this configuration, it is possible to improve display quality by light which is incident from the opening being shielded by the contact electrode.

An electronic device according to another aspect of the invention includes any of the electro-optical apparatuses.

According to this configuration, it is possible to provide an electronic device including an electro-optical apparatus in which it is possible to reduce the resistance value of a terminal while preventing a reduction of reflectivity of the reflective electrode.

A manufacturing method of the electro-optical apparatus according to still another aspect of the invention having a structure that includes a display region in which a plurality of light-emitting elements are arranged in a matrix form, and a peripheral region in which a terminal is disposed outside the display region, the light-emitting element has a structure in which a reflective electrode, an optical adjustment layer, a first electrode, a light-emitting layer, and a second electrode are laminated and the first electrode is electrically connected to a contact electrode, and the terminal is laminated with a first terminal layer, a second terminal layer, and a third terminal layer, includes forming the reflective electrode in the display region, and forming the first terminal layer in the peripheral region by forming a first conductive film, and patterning the first conductive film; forming the contact electrode in the display region, and laminating the second terminal layer on the first terminal layer in the peripheral region by forming a second conductive film, and patterning the second conductive film; and forming the first electrode in the display region, and laminating the third terminal layer on the second terminal layer in the peripheral region by forming a third conductive film, and patterning the third conductive film.

According to this method, it is possible to manufacture a terminal in which the first terminal layer, the second terminal layer, and the third terminal layer are laminated during a process for manufacturing the light-emitting element using the first conductive film which is the same as the reflective electrode in the first terminal layer, the second conductive film which is the same as the contact electrode in the second terminal layer, and the third conductive film which is the same as the first electrode in the third terminal layer. In addition, it is possible to reduce the resistance value of the terminal while preventing a reduction of reflectivity of the reflective electrode.

In addition, the manufacturing method of the electro-optical apparatus may be a method in which the third conductive film includes a transparent conductive material, the second conductive film includes a conductive material with a higher conductivity than the third conductive film, and the first conductive film includes a reflective conductive material.

According to this method, in the manufactured terminal, it is possible to further reduce the resistance value of the terminal than the case in which the reflective conductive material and the transparent conductive material are directly laminated by forming the second conductive film that includes a conductive material with a higher conductivity than the third conductive film between the first conductive film that includes the reflective conductive material and the third conductive film that includes the transparent conductive material. In addition, since the reflective electrode is formed by the first conductive film which includes a reflective conductive material, it is possible to prevent a reduction in reflectivity of the reflective electrode.

In addition, the manufacturing method of the electro-optical apparatus may be a method in which the third conductive film includes indium tin oxide, the second conductive film includes titanium nitride, and the first conductive film includes aluminum and copper.

According to this method, in the manufactured terminal, it is possible to reduce a resistance value of the terminal by forming the second conductive film which contains titanium nitride between the first conductive film which includes aluminum and copper and the third conductive film which includes indium tin oxide. In addition, since the reflective electrode is formed using the first conductive film which includes aluminum and copper, it is possible to prevent a reduction in reflectivity of the reflective electrode.

BRIEF DESCRIPTION OF THE DRAWINGS

The invention will be described with reference to the accompanying drawings, wherein like numbers reference like elements.

FIG. 2 is a circuit diagram illustrating a configuration of an element substrate which the organic EL apparatus that is illustrated in FIG. 1 is provided with.

FIG. 3 is a circuit diagram illustrating a configuration of a pixel circuit which the organic EL apparatus that is illustrated in FIG. 1 is provided with.

FIG. 4 is a planar view illustrating a configuration of a pixel which the organic EL apparatus that is illustrated in FIG. 1 is provided with.

FIG. 5A is a sectional view using a line segment VA-VA which is illustrated in FIG. 4, and FIG. 5B is an enlarged sectional view of a portion of a pixel which is illustrated in FIG. 5A.

FIG. 6A is a sectional view using a line segment VIA-VIA which is illustrated in FIG. 4, FIG. 6B is a sectional view using a line segment VIB-VIB which is illustrated in FIG. 4, and FIG. 6C is a sectional view using a line segment VIC-VIC which is illustrated in FIG. 4.

FIG. 10 is a planar view illustrating another configuration example of a pixel which an organic EL apparatus according to an embodiment of the invention is provided with.

DESCRIPTION OF EXEMPLARY EMBODIMENTS

Organic EL Apparatus

Figure 1:
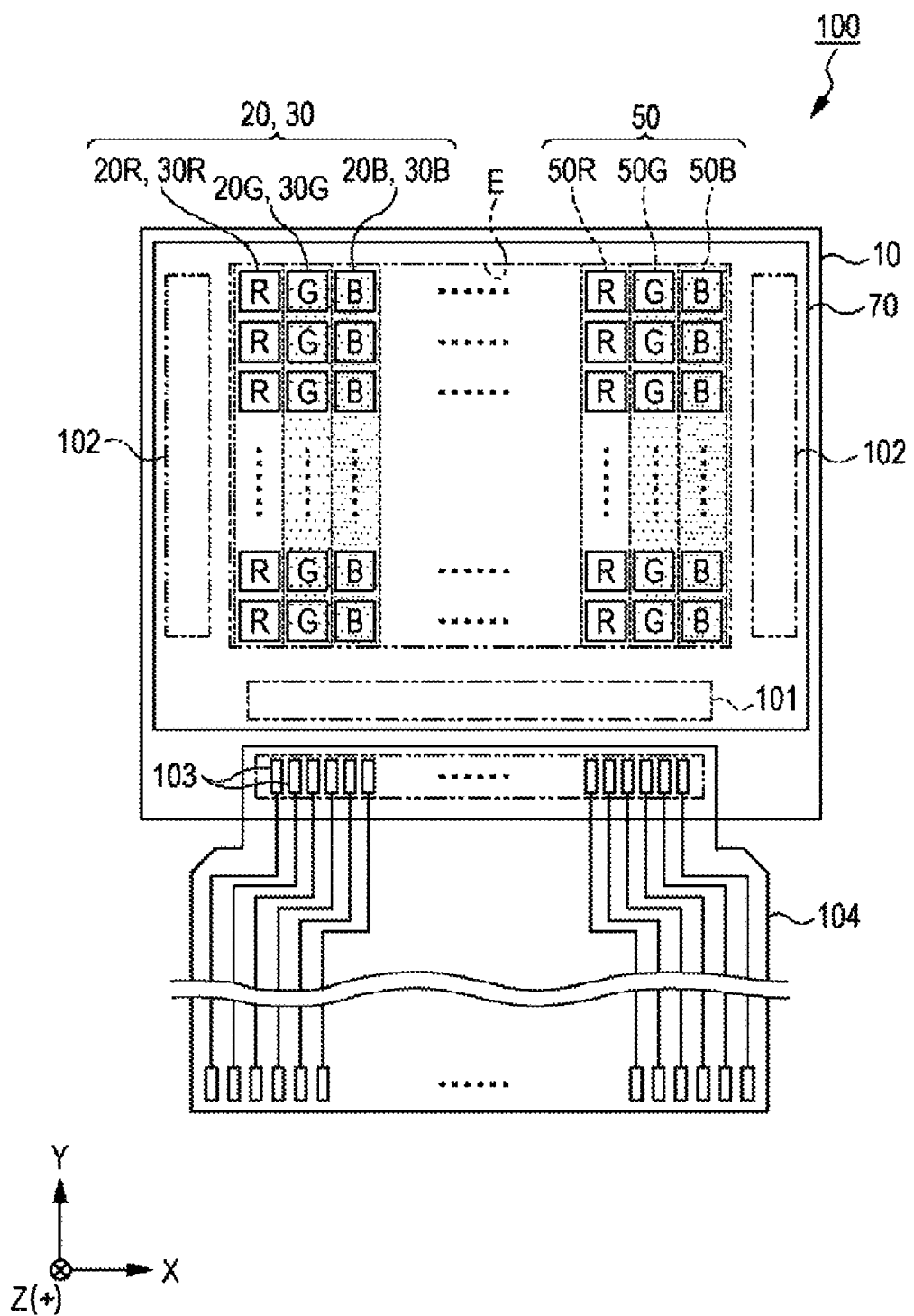
FIG. 1 is a planar view illustrating a configuration of an organic EL apparatus according to an embodiment of the invention.

First, an organic EL apparatus 100 which is illustrated in FIG. 1 will be described as an embodiment of the invention. The organic EL apparatus 100 is a self-luminous type display apparatus which is illustrated as an example of an "electro-optical apparatus" in the invention. Here, FIG. 1 is a planar view schematically illustrating a configuration of the organic EL apparatus 100.

As shown in FIG. 1, the organic EL apparatus 100 has an element substrate 10 and a protective substrate 70. The element substrate 10 and the protective substrate 70 are joined using an adhesive, which is omitted from the drawings, in a state of facing each other. Here, for the adhesive it is possible use, for example, epoxy resin, acrylic resin, or the like.

As a light-emitting element, the element substrate 10 has a display region E in which a pixel 20B on which an organic EL element 30B that emits blue (B) light is disposed, a pixel 20G on which an organic EL element 30G that emits green (G) light is disposed, and a pixel 20R on which an organic EL element 30R that emits red (R) light is disposed are arranged in a matrix form.

The organic EL apparatus 100 is provided with a full color display in which the pixel 20B, the pixel 20G, and the pixel 20R are the display units. Here, in the description below, there are cases in which the pixel 20B, the pixel 20G, and the pixel 20R are treated collectively as a pixel 20, and there are cases in which the organic EL element 30B, the organic EL element 30G, and the organic EL element 30R are treated collectively as an organic EL element 30.

A color filter layer 50 is provided in the display region E. Within the color filter layer 50 a blue color filter layer 50B is disposed on the organic EL element 30B of the pixel 20B, a green color filter layer 50G is disposed on the organic EL element 30G of the pixel 20G, and a red color filter layer 50R is disposed on the organic EL element 30R of the pixel 20R.

In the embodiment, the pixel 20 in which emitted light of the same color is obtained is arranged in the Y direction (first direction), and the pixel 20 in which emitted light of different colors is obtained is arranged in the X direction (second direction) which intersects with (is orthogonal to) the Y direction. Accordingly, the disposition of the pixels 20 is a so-called stripe method. According to the arrangement of the pixels, the organic EL element 30B, the organic EL element 30G, and the organic EL element 30R are each disposed in a stripe form, and the blue color filter layer 50B, the green color filter layer 50G, and the red color filter layer 50R are also disposed in a stripe form. Here, the disposition of the pixels 20 is not limited to the stripe method, and may be a mosaic method or a delta method.

The organic EL apparatus 100 has a top emission structure. Accordingly, light which is emitted by the organic EL element 30 passes through the color filter layer 50 of the element substrate 10 and is emitted as display light from the protective substrate 70 side.

Since the organic EL apparatus 100 has a top emission structure, it is possible to use an opaque ceramic substrate, a semiconductor substrate, or the like in addition to a transparent quartz substrate, a glass substrate, or the like as the base material of the element substrate 10. In the embodiment, a silicon substrate (semiconductor substrate) is used as the element substrate 10.

A peripheral region F in which an external connection terminal 103 is arranged is provided outside the display region E. A plurality of external connection terminals 103 are arranged along a side of the long side of the element substrate 10 outside the peripheral region F. In addition, a data line driving circuit 101 is provided between the plurality external connection terminals 103 and the display region E. In addition, a scanning line driving circuit 102 is provided between two sides of the short side of the element substrate 10 and the display region E. Here, in the description below, a direction along the long side of the element substrate 10 is the X direction, a direction along the short side of the element substrate 10 is the Y direction, and a direction from the protective substrate 70 toward the element substrate 10 is the Z(+) direction.

The protective substrate 70 is smaller than the element substrate 10, and is disposed facing the element substrate 10 such that the external connection terminals 103 are exposed. The protective substrate 70 is a substrate with light transmissivity, and is able to use a quartz substrate, a glass substrate, or the like. The protective substrate 70 has a role of protecting the organic EL element 30 which is arranged in the display area E from damage, and is provided so as to be wider than the display region E.

Figure 2:
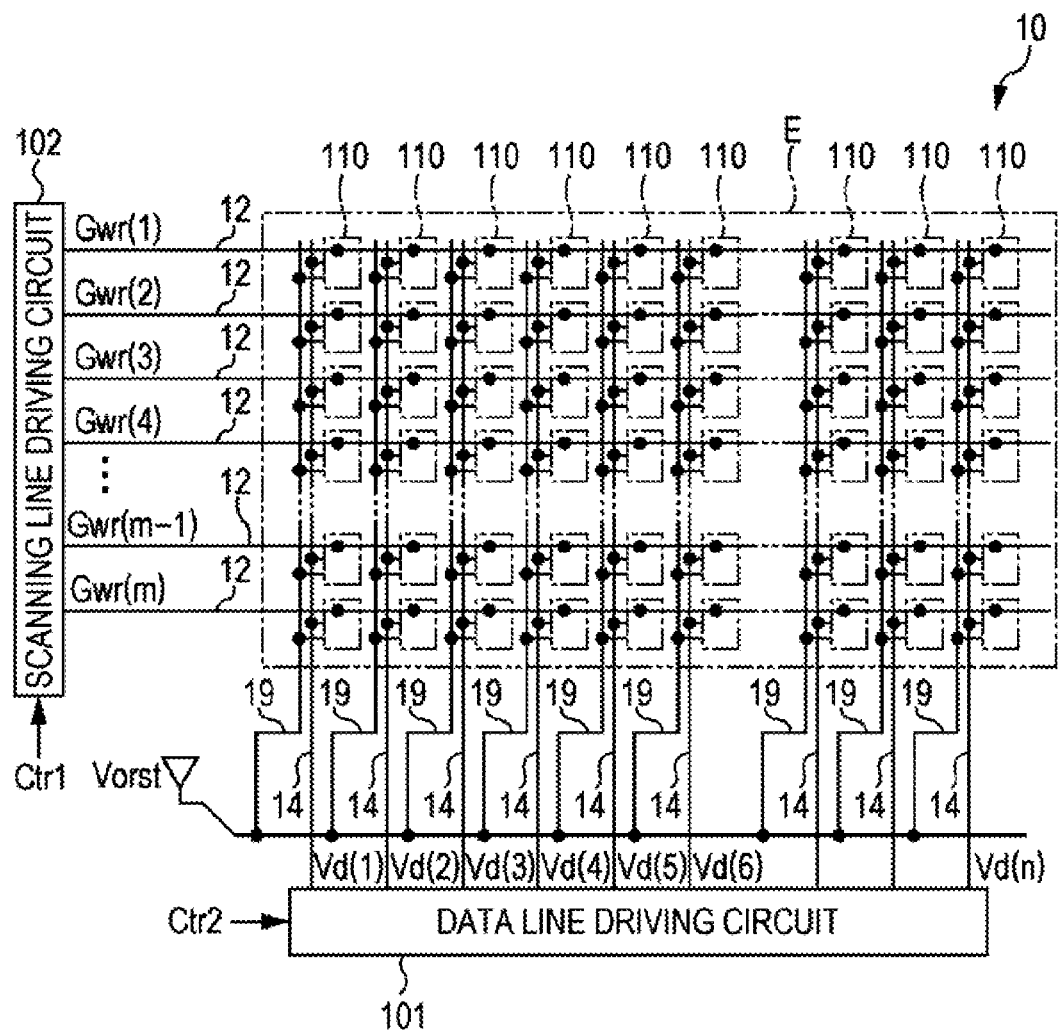

FIG. 2 is a circuit view illustrating a configuration of the element substrate 10. As shown in FIG. 2, on the element substrate 10, m rows of scanning lines 12 are provided extending in the X direction, and n columns of data lines 14 are provided extending in the Y direction. In addition, on the element substrate 10, a power supply line 19 is provided extending in the Y direction in each column along the data lines 14.

Pixel circuits 110 corresponding to intersection sections of m rows of scanning lines 12 and n columns of data lines 14 are provided on the element substrate 10. The pixel circuits 110 form a portion of the pixels 20. m rows×n columns of the pixel circuits 110 are arranged in a matrix form in the display region E.

A reset potential for initialization Vorst is supplied (fed) to the power supply line 19. Furthermore, although omitted from the drawings, three control lines which supply control signals Gcmp, Gel, and Gorst are provided in parallel to the scanning lines 12.

The scanning lines 12 are electrically connected to the scanning line driving circuit 102. The data lines 14 are electrically connected to the data line driving circuit 101. A control signal Ctr1 for controlling the scanning line driving circuit 102 is supplied to the scanning line driving circuit 102. A control signal Ctr2 for controlling the data line driving circuit 101 is supplied to the data line driving circuit 101.

The scanning line driving circuit 102 generates scanning signals Gwr(1), Gwr(2), Gwr(3), . . . , Gwr(m−1), Gwr(m) in order to scan the scanning lines 12 over a period of a frame in each row according to the control signal Ctr1. Furthermore, in addition to the scanning signal Gwr, the scanning line driving circuit 102 supplies the control signals Gcmp, Gel, and Gorst to the control lines. Here, the frame period is a period in which an image of one cut (frame) is displayed using the organic EL apparatus 100, and for example, if the frequency of a vertical synchronization signal which includes a synchronization signal is 120 Hz, one frame period is approximately 8.3 milliseconds.

The data line driving circuit 101 supplies potential data signals Vd(1), Vd(2), ..., Vd(n) according to gradation data of the pixel circuit 110 to the data lines 14 of 1, 2, ..., n columns with respect to the pixel circuit 110 which is positioned in a row that is selected by the scanning line driving circuit 102.

Figure 3:
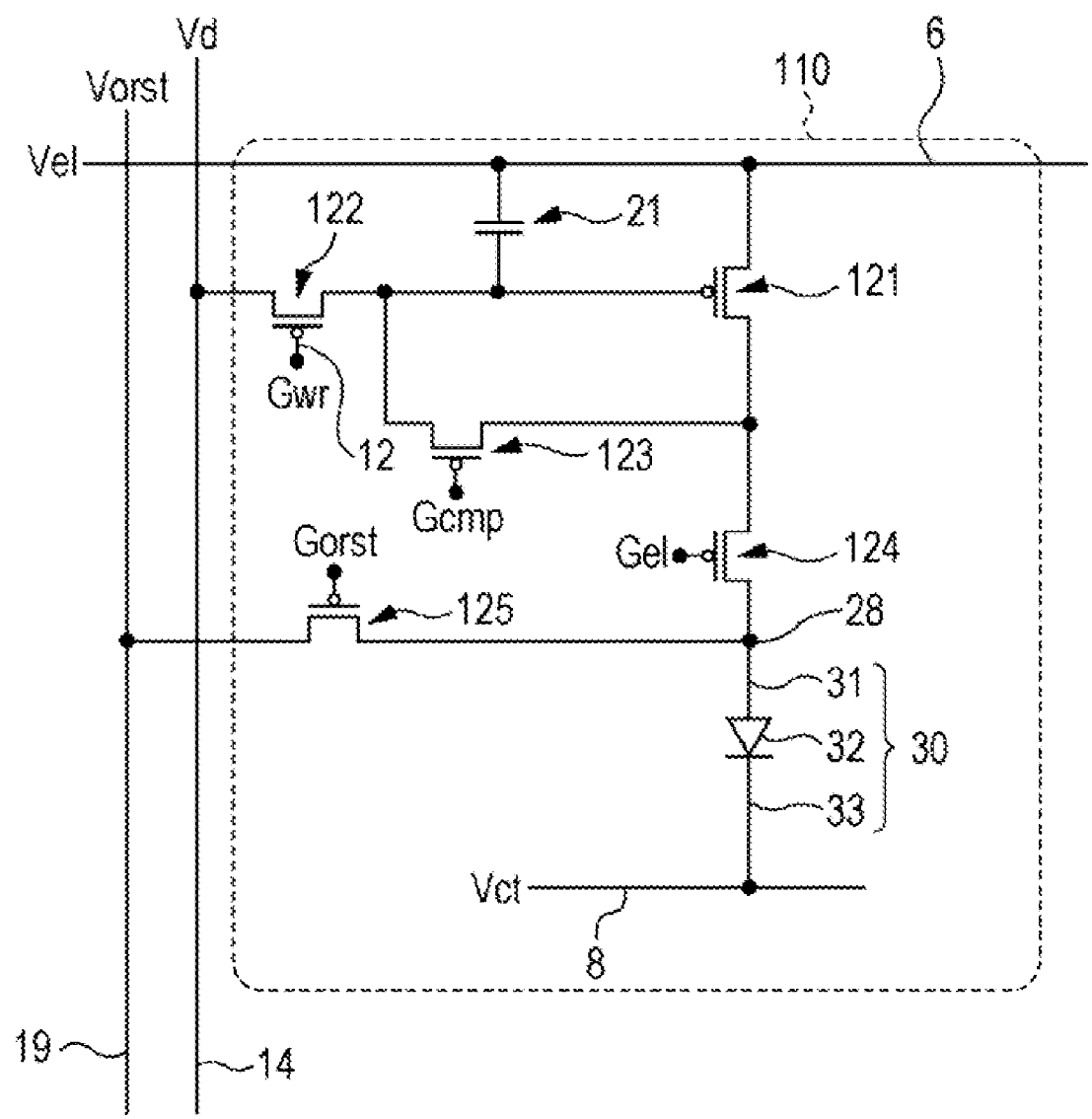

FIG. 3 is a circuit view illustrating a configuration of the pixel circuit 110. As shown in FIG. 3, the pixel circuit 110 has P-channel MOS transistors 121, 122, 123, 124, and 125, the organic EL element 30, and a capacitor 21. The scanning signal Gwr, the control signals Gcmp, Gel, Gorst, and the like which are described above are supplied to the pixel circuit 110.

The organic EL element 30 has a structure in which a light-emitting function layer (light-emitting layer) 32 is interposed by a pixel electrode (first electrode) 31 and a counter electrode (second electrode) 33 which face each other.

The pixel electrode 31 is an anode which supplies a positive hole in the light-emitting function layer 32, and is formed using a conductive material which has light permeability. In the embodiment, an indium tin oxide (ITO) film with a film thickness of, for example, 200 nm is formed as the pixel electrode 31. The pixel electrode 31 is electrically connected to a drain of the transistor 124 and one of a source or a drain of the transistor 125.

The counter electrode 33 is a cathode which supplies electrons to the light-emitting function layer 32, and is formed using a conductive material which has light permeability and light reflectivity such as, for example, an alloy of magnesium (Mg) and silver (Ag). The counter electrode 33 is a common electrode which is provided over a plurality of pixels 20, and is electrically connected to a power supply line 8. A potential Vct which is the lowest potential power source in the pixel circuit 110 is supplied in the power supply line 8.

The light-emitting function layer 32 has a positive hole injection layer, a positive hole transport layer, an organic light-emitting layer, an electron transport layer, and the like laminated in that order from the pixel electrode 31 side. In the organic EL element 30, the light-emitting function layer 32 emits light by the positive hole which is supplied from the pixel electrode 31 and the electrons which are supplied form the counter electrode 33 being joined in the middle of the light-emitting function layer 32.

In addition, a power supply line 6 which intersects with each power supply line 19 is provided on the element substrate 10 so as to extend in the X direction. Here, the power supply line 6 may be provided so as to extend in the Y direction, and may be provided so as to extend in both the X direction and the Y direction. The transistor 121 is electrically connected to the power supply line 6 by the source, and is respectfully electrically connected to the other of the source or drain of the transistor 123 and the source of the transistor 124. In addition, a potential Vel which is the highest potential power source in the pixel circuit 110 is supplied in the power supply line 6. In addition, one end of the capacitor 21 is electrically connected to the power supply line 6. The transistor 121 functions as a driving transistor through which current flows according to the voltage between a gate and the source of the transistor 121.

The gate of the transistor 122 is electrically connected to the scanning lines 12, and one of the source or the drain are electrically connected to the data lines 14. In addition, the other of the source or the drain of the transistor 122 is respectively electrically connected to the gate of the transistor 121, the other capacitor 21, and one of the source or the drain of the transistor 123. The transistor 122 is electrically connected between the gate of the transistor 121 and the data lines 14, and functions as a write-in transistor which controls the electrical connection between the gate of the transistor 121 and the data lines 14.

The transistor 123 is electrically connected to the control line by the gate, and is supplied with the control signal Gcmp. The transistor 123 controls the electrical connection between the gate and the drain of the transistor 121, and functions as a threshold compensation transistor.

The transistor 124 is electrically connected to the control line by the gate, and is supplied with the control signal Gel. The drain of the transistor 124 is respectively electrically connected to one of the source or the drain of the transistor 125 and the pixel electrode 31 of the organic EL element 30. The transistor 124 controls the electrical connection between the drain of the transistor 121 and the pixel electrode 31 of the organic EL element 30, and functions as a light-emission control transistor.

The transistor 125 is electrically connected to the control line by the gate, and is supplied with the control signal Gorst. In addition, the other of the source or the drain of the transistor 125 is electrically connected to the power supply line 19, and is supplied with the reset potential Vorst. The transistor 125 functions as an initialization transistor which controls the electrical connection between the power supply line 19 and the pixel electrode 31 of the organic EL element 30.

Figure 4:
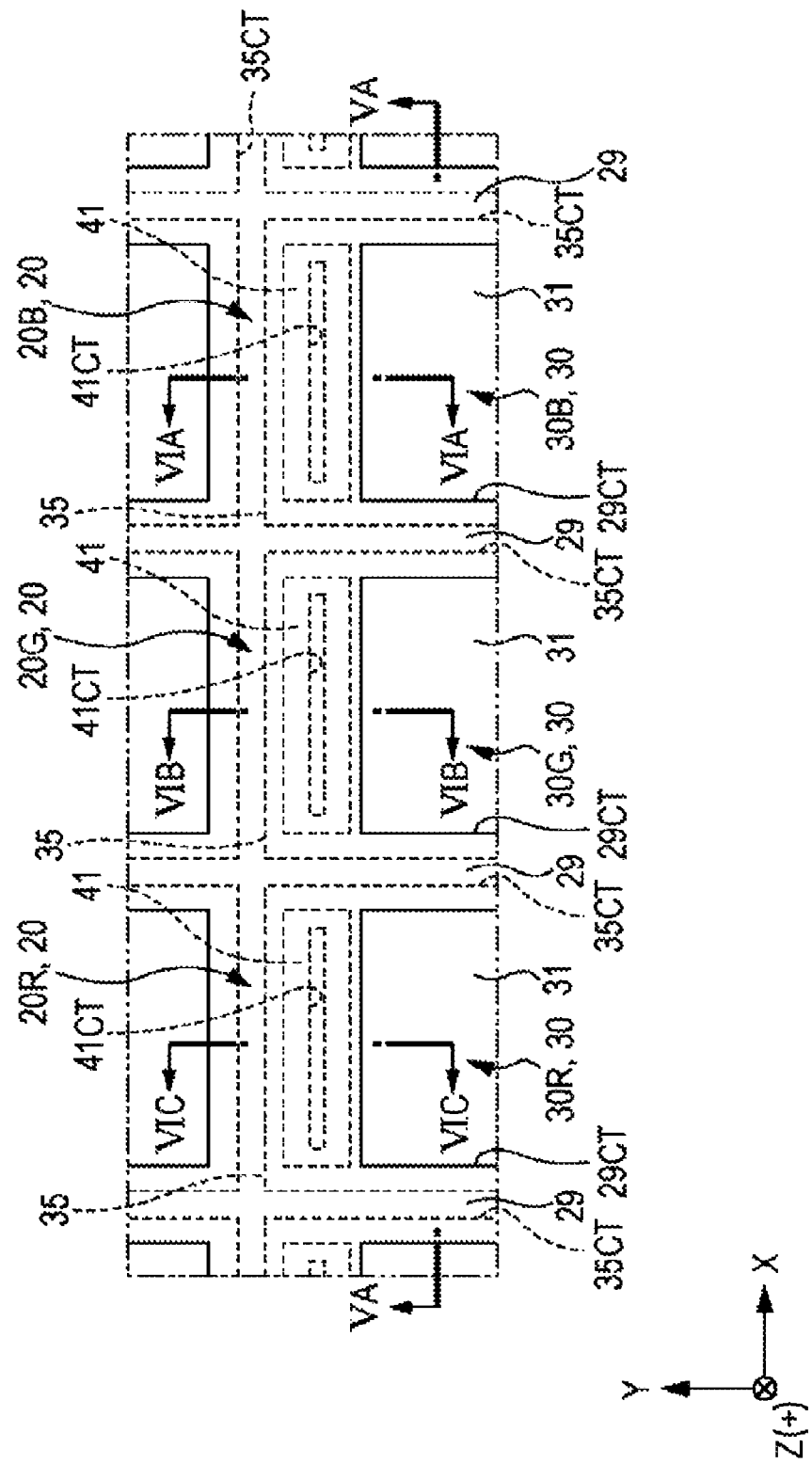

FIG. 4 is a planar view illustrating a configuration of the pixels 20 (pixels 20B, 20G, and 20R). FIG. 5A is a sectional view along the X direction of the pixels 20B, 20G, and 20R using a line segment VA-VA which is illustrated in FIG. 4. FIG. 5B is an enlarged sectional view of a portion of the pixel 20R which is illustrated in FIG. 5A. FIG. 6A is a sectional view along the Y direction of the pixel 20B using a line segment VIA-VIA which is illustrated in FIG. 4. FIG. 6B is a sectional view along the Y direction of the pixel 20G using a line segment VIB-VIB which is illustrated in FIG. 4. FIG. 6C is a sectional view along the Y direction of the pixel 20R using a line segment VIC-VIC which is illustrated in FIG. 4.

As shown in FIGS. 4, 5A, and 5B, each of the pixels 20B, 20G, and 20R are disposed such that a short direction is parallel to the X direction (a long direction is parallel to the Y direction) in order to respectively take a rectangular shape in planar view. In addition, the pixel separation layer 29 is provided among each of the organic EL elements 30B, 30G, and 30R.

The pixel separation layer 29 is made from an insulation layer, and electrically insulates between the adjacent organic EL elements 30B, 30G, and 30R. In the embodiment, a silicon oxide ($SiO_2$) film with, for example, a film thickness of 25 nm is formed as the pixel separation layer 29. The pixel separation layer 29 is provided so as to cover the peripheral edge section of the pixel electrode 31 of each of the pixels 20B, 20G, and 20R. That is, an opening 29CT which exposes a portion of the pixel electrode 31 of each of the pixels 20B, 20G, and 20R is provided in the pixel separation layer 29. The opening 29CT specifies a light-emitting region of each of the pixels 20 in order to take a rectangular shape in planar view.

As shown in FIGS. 5A, 5B, and 6A to 6C, the organic EL elements 30B, 30G, and 30R which are disposed respectively in the pixels 20B, 20G, and 20R have a resonant structure (cavity structure) in which a reflective electrode 35, a reflection enhancing layer 36, a protective layer 37, an optical path adjustment layer 38, the first electrode 31, the light-emitting layer 32, and the second electrode 33 are laminated on an interlayer insulation layer (insulation layer) 34. Here, in FIGS. 4, 5A, 5B, and 6A to 6C, illustration is omitted of the light-emitting function layer 32 and the counter electrode 33 which are described above.

In the resonant structure, it is possible to emit light of a specific wavelength (resonant wavelength) by increasing the strength according to an optical distance between the reflective layer 35 and the second electrode 33 which is adjusted according to the optical path adjustment layer 38 while light which is emitted by the light-emitting layer 32 is repeatedly reflected between the reflective layer 35 and the counter electrode 33.

For example, an insulating material such as silicon oxide ($SiO_2$) is used in the interlayer insulation layer 34. Here, in FIG. 5A, although only the transistor 124 is indicated below the interlayer insulation layer 34, other than the transistor 124, the transistors 121, 122, 123, 124, and 125, which are configured by the scanning lines 12, the data lines 14, the power supply line 19, the control line, the power supply line 6, and the pixel circuit 110, the capacitor 21, and the like are disposed below the interlayer insulation layer 34. There is a possibility that concavities and convexities are formed on the surface of the interlayer insulation layer 34 according to the transistor, a wiring, or the like, but it is preferable to flatten the surface on which the reflective electrode 35 is formed.

The reflective electrode 35 is disposed by being split in each pixel 20. That is, the reflective electrode 35 is provided in each of the pixels 20B, 20G, and 20R. In addition, a gap 35CT is formed between each adjacent reflective electrode 35. Accordingly, the gap 35CT is formed between each adjacent reflective electrode 35, is electrically separate from each pixel 20, and is configured such that different potentials are appliable.

The reflective electrode 35 is made from a conductive material which has light reflectivity, and is formed in a rectangular shape in planar view. The reflective electrode 35 is larger than the pixel electrode 31, and specifies a reflection region for each pixel 20. In the embodiment, for example, a film alloy of aluminum (Al) and copper (Cu) (AlCu) with a film thickness of 100 nm which is a second layer 35b is formed on a titanium (Ti) film with a film thickness of 30 nm which is a first layer 35a as the reflective electrode 35.

The reflective electrode 35 is electrically connected to the drain of the transistor 124, which is described above, via a first contact electrode 28 (refer to FIGS. 3 and 5A) which is disposed so as to pass through the interlayer insulation layer 34. In addition, the reflective electrode 35 is electrically connected to one of the source or the drain (not shown in the drawings) of the transistor 125 via the first contact electrode 28. For the first contact electrode 28, for example, it is possible to use a conductive material such as tungsten (W), titanium (Ti), or titanium nitride (TiN). In the embodiment, the first layer 35a of the reflective electrode 35 is connected to the first contact electrode 28.

The reflection enhancing layer 36 is for increasing reflectivity using the reflective electrode 35, and if made from, for example, an insulation material which has light permeability. The reflection enhancing layer 36 is disposed so as to cover the surface of the reflective electrode 35. In the embodiment, a silicon oxide ($SiO_2$) film with, for example, a film thickness of 40 nm is formed as the reflection enhancing layer 36.

The protective layer 37 is provided so as to cover the surface of the reflective electrode 35 on which the gap 35CT is formed. The protective layer 37 has a first insulation film 39, and an embedded insulation film 40. The first insulation film 39 is provided on the surface of the reflection enhancing layer 36, the reflective electrode 35, and the interlayer insulation layer 34, and is formed along the gap 35CT. Accordingly, the first insulation film 39 has the concave section 39a which corresponds to the gap 35CT. The embedded insulation film 40 is formed so as to be embedded in the concave section 39a. In the protective layer 37, the surface on a side which comes into contact with the optical path adjustment layer 38 is flattened by the embedded insulation film which is embedded in the concave section 37a. In the embodiment, a silicon nitride (SiN) film with, for example, a film thickness of 80 nm is formed as the first insulation film 39, and a silicon oxide ($SiO_2$) film is formed as the embedded insulation film 40.

The optical path adjustment layer 38 has insulation films 38a and 38b which are disposed on the surface of the protective layer 37. The optical path adjustment layer 38 performs optical path adjustment in each pixel 20B, 20G, and 20R according to the optical distance between the reflective electrode 35 and the counter electrode 33.

In detail, the film thickness of the optical path adjustment layer 38 becomes larger in order of the pixel 20B, the pixel 20G, and the pixel 20R. That is, as shown in FIG. 6A, in the pixel 20B, the insulation films 38a and 38b are omitted such that, for example, the resonant wavelength (peak wavelength where luminance is maximum) is 470 nm. As shown in FIG. 6B, in the pixel 20G, the insulation film 38a is provided, for example, such that the resonant wavelength is 540 nm. As shown in FIG. 6C, in the pixel 20R, the insulation films 38a and 38b are provided, for example, such that the resonant wavelength is 610 nm. In the embodiment, a silicon oxide ($SiO_2$) film with, for example, a film thickness of 40 nm is formed as the insulation film 38a, and a silicon oxide ($SiO_2$) film with, for example, a film thickness of 50 nm is formed as the insulation film 38b. In addition, the reflection enhancing layer 36 and the protective layer 37 perform optical path adjustment according to the optical distance between the reflective electrode 35 and the counter electrode 33, and for example, in the pixel 20B, the film thickness of the reflection enhancing layer 36 and the protective layer 37, for example, the resonant wavelength (peak wavelength where luminance is maximum) is 470 nm.

Thereby, blue (B) light is emitted from the pixel 20B with a peak wavelength of 470 nm, green (G) light is emitted from the pixel 20G with a peak wavelength of 540 nm, and red (R) light is emitted from the pixel 20R with a peak wavelength of 610 nm. In the organic EL apparatus 100, color purity of display light which is emitted from each pixel 20 is increased using the organic EL element 30 which has such a resonant structure.

The optical path adjustment layer 38 is provided among each of the organic EL elements 30B, 30G, and 30R. In detail, the optical path adjustment layer 38 is configured from the same type of material as the embedded insulation film 40, and the optical path adjustment layer 38 is provided so as to cover the embedded insulation film 40. According to such a configuration, the optical path adjustment layer 38 is processable according to the resonant wavelength without impairing the flatness of the surface on the pixel electrode 31 side of the protective layer 37. In the embodiment, the optical path adjustment layer 38 and the embedded insulation film 40 are configured using silicon oxide ($SiO_2$).

As shown in FIGS. 5A, 5B, and 6A to 6C, the pixel electrode 31 is disposed on the optical path adjustment layer 38. The pixel electrode 31 is electrically connected to the reflective electrode 35 via a second contact electrode 41. In detail, a contact hole 41CT is provided such that the protective layer 37 and the reflection enhancing layer 36 pass therethrough. The contact hole 41CT is positioned below a region which does not overlap with the opening 29CT in planar view, that is, a region in which the pixel separation layer 29 is formed.

The second contact electrode 41 has a first contact section 41a and a second contact section 41b. The first contact section 41a is disposed within the contact hole 41CT, and is connected to the second layer 35b of the reflective electrode 35. The second contact section 41b is disposed on the surface of the protective layer 37, and is connected to the pixel electrode 31. In the embodiment, for example, a titanium nitride (TiN) film is formed as the second contact electrode 41, and the thickness of the second contact section 41b is formed so as to be 50 nm.

As shown in FIGS. 5A, 5B, and 6A to 6C, a portion of the optical path adjustment layer 38 is formed so as to overlap with the second contact electrode 41. According to this configuration, it is possible to dispose the second contact electrode 41 in the vicinity of the region among each of the organic EL elements 30B, 30G, and 30R without impairing the flatness of the surface on the pixel electrode 31 side of the protective layer 37. Thereby, it is possible to reduce the size of a region that does not contribute to light emission, and it is possible to increase the aperture ratio of each pixel 20.

As shown in FIG. 6A, in the pixel 20B, the insulation films 38a and 38b which configure the optical path adjustment layer 38 are provided in a region which overlaps with a portion of the second contact electrode 41, or the embedded insulation film 40. The insulation films 38a and 38b which configure the optical path adjustment layer 38 are not provided on the surface of a portion of the second contact electrode 41, and therein a conductive material which configures the pixel electrode 31 is laminated on the second contact electrode 41, and the conductive material which configures the pixel electrode 31 comes into contact with the second contact electrode 41.

As shown in FIG. 6B, in the pixel 20G, the insulation film 38a which configures the optical path adjustment layer 38 is provided in a region which overlaps with a portion of the second contact electrode 41, or the embedded insulation film 40. Then, the contact hole is provided in the insulation film 38b, the conductive material which configures the pixel electrode 31 is disposed inside the contact hole, and the pixel electrode 31 is connected to the second contact electrode 41. In the pixel 20G, the insulation film 38b which configures the optical path adjustment layer 38 is provided substantially on the entire surface except for the contact hole. In more detail, the insulation film 38a which configures the optical path adjustment layer 38 is provided in a region which overlaps with a portion of the second contact electrode 41, the reflective electrode 35, or the embedded insulation film 40.

As shown in FIG. 6C, in the pixel 20R, the insulation films 38a and 38b which configure the optical path adjustment layer 38 are provided in a region which overlaps with a portion of the second contact electrode 41, the reflective electrode 35, or the embedded insulation film 40. Then, the contact hole is provided in the insulation films 38a and 38b, the conductive material which configures the pixel electrode 31 is disposed within the contact hole, and the pixel electrode 31 is connected to the second contact electrode 41.

Here, although omitted from the drawings, the light-emitting function layer 32 and the counter electrode 33 which are described above are disposed on the pixel electrode 31, and furthermore on top, cover the surface of the element substrate 10, and prevent infiltration of moisture, oxygen, and the like in the organic EL element 30 by disposing a sealing layer (passivation film), which flattens the surface of the organic EL element 30. The color filter layer 50 which is described above is disposed on the surface of the sealing layer.

Figure 7:
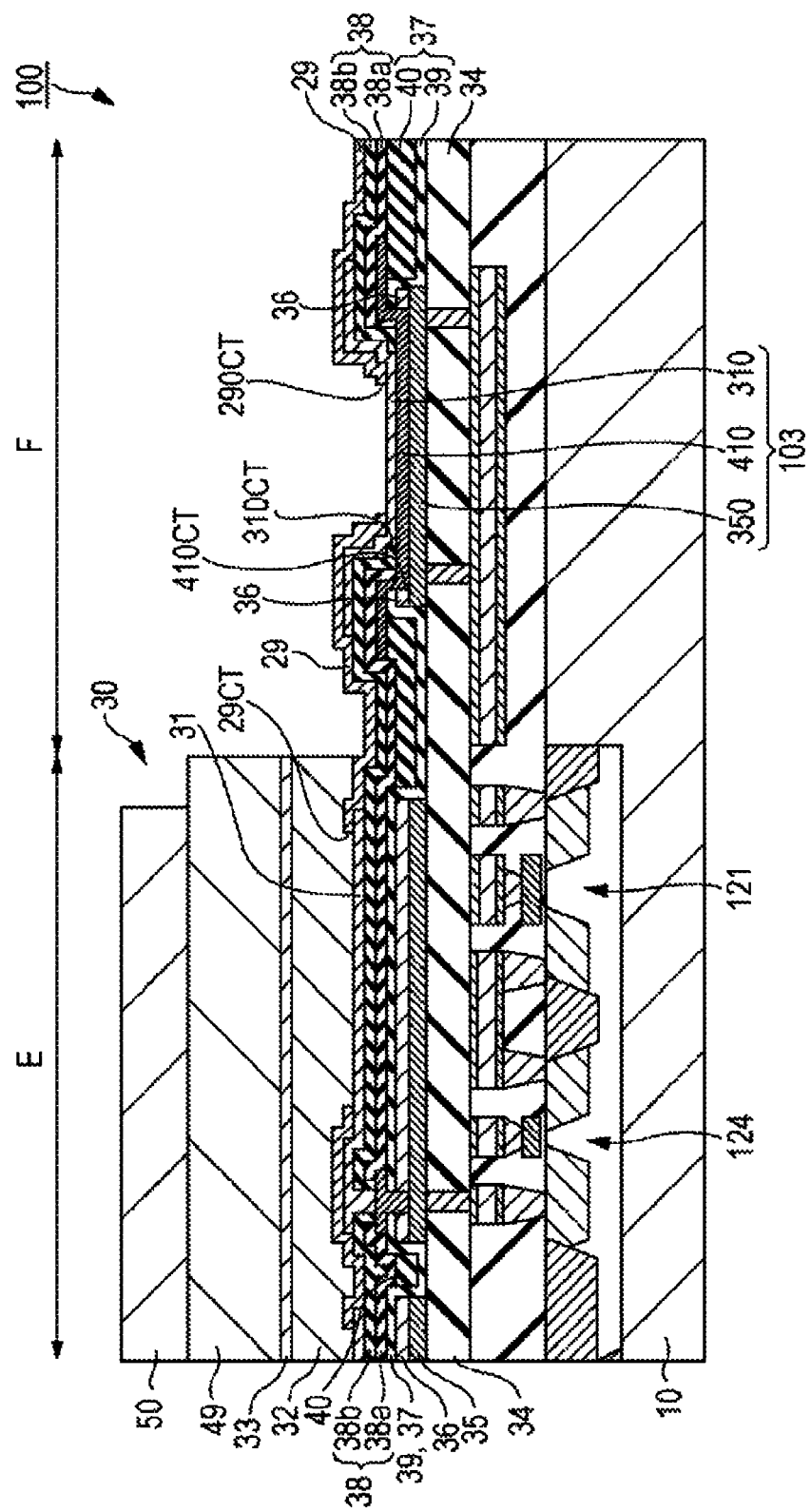
FIG. 7 is a sectional view between a display region and a peripheral region of the organic EL apparatus which is illustrated in FIG. 1.

Here, FIG. 7 is a sectional view between the display region E and the peripheral region F of the organic EL apparatus 100. In addition, FIG. 8A is a planar view of a configuration of the external connection terminal 103, and FIG. 8B is sectional view using a line segment VIIIB-VIIIB which is illustrated in FIG. 8A.

Figure 8A:
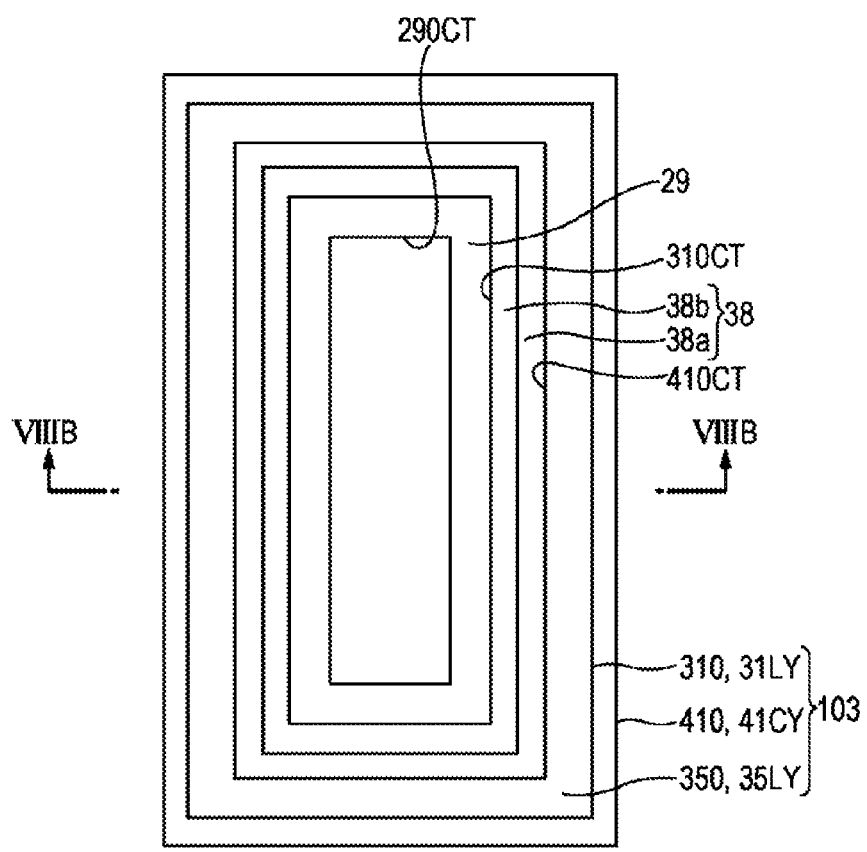
FIG. 8A is a planar view illustrating a configuration of a terminal.
Figure 8B:
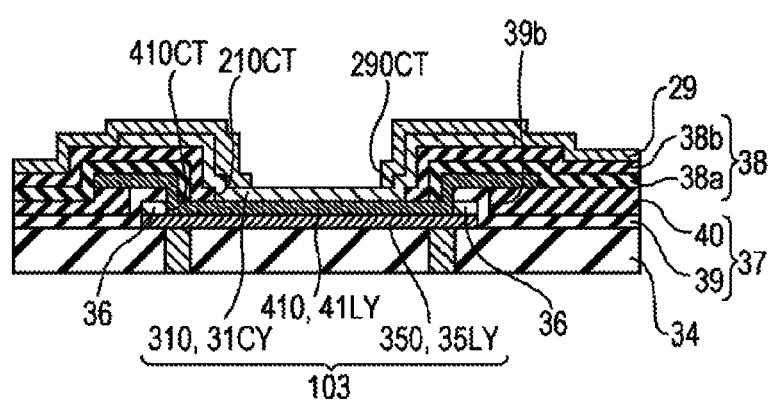
FIG. 8B is sectional view using a line segment VIIIB-VIIIB which is illustrated in FIG. 8A.

As shown in FIGS. 7, 8A and 8B, in the organic EL apparatus 100 of the embodiment, the external connection terminal 103 has a structure in which a first terminal layer 350 that is formed by a first conductive film 35LY which is the same as the reflective electrode 35, a second terminal layer 410 that is formed by a second conductive film 41LY which is the same as the contact electrode 41, and a third terminal layer 310 that is formed by a third conductive film 31LY which is the same as the pixel electrode 31 are laminated in that order in the peripheral region F which is formed in the display region E.

The first terminal layer 350 is formed with a rectangular shape in planar view on the surface of the interlayer insulation layer 34. The reflection enhancing layer 36 is disposed so as to cover the first terminal layer 350. The first insulation film 39 of the protective layer 37 is formed such that the first insulation film 39 covers the surface of the interlayer insulation layer 34 on which the first terminal layer 350 and the reflection enhancing layer 36 are disposed. The embedded insulation film 40 of the protective layer 37 is embedded in a concave section 39b which is formed in the first insulation film 39. Using such a structure, the surface on the second terminal layer 410 side of the protective layer 37 is flattened.

A first contact hole 410CT though which the reflection enhancing layer 36 and the protective layer 37 (the first insulation film 39) pass is formed on the first terminal layer 350. The second terminal layer 410 is disposed on the surface of the protective layer 37 in a state of being embedded in the first contact hole 410CT. Thereby, the second terminal layer 410 is laminated on the surface of the first terminal layer 350 (the first conductive film 35LY) which is exposed from the first contact hole 410CT.

The optical path adjustment layer 38 is disposed such that the surface of the protective layer 37, on which the second terminal layer 410 is disposed, is covered by the insulation films 38a and 38b. A second contact hole 310CT which passes through the optical path adjustment layer 38 is formed on the second terminal layer 410. The third terminal layer 310 is disposed on the surface of the optical path adjustment layer 38 in a state of being embedded in the second contact hole 310CT. Thereby, the third terminal layer 310 is laminated on the surface of the second terminal layer 410 (the second conductive film 41LY) which is exposed from the second contact hole 310CT.

The pixel separation layer 29 is disposed so as to cover the surface of the optical path adjustment layer 38 on which the second terminal layer 410 is disposed. A terminal opening section 290CT which exposes the external connection terminal 103 (the third terminal layer 310) is provided on the pixel separation layer 29.

In the embodiment, the first conductive film 35LY is made from an AlCu film, the second conductive film 41LY is made from a TiN film, and the third conductive film 31LY is made from an ITO film. That is, the second conductive film 41LY is made from a conductive material with higher conductivity than the third conductive film 31LY.

In this case, it is possible to further reduce the resistance value of the external connection terminal 103 than in a case where the first terminal layer 350 (first conductive film 35LY) and the third terminal layer 310 (the third conductive film 31LY) are directly laminated, by providing the second terminal layer 410 (second conductive film 41LY) between the first terminal layer 350 (first conductive film 35LY) and the third terminal layer 310 (third conductive film 31LY) in the external connection terminal 103. In addition, since the reflective electrode 35 is formed using the first conductive film 35LY, it is possible to prevent a reduction in reflectivity of the reflective electrode 35.

In addition, when manufacturing the organic EL apparatus 100 of the embodiment, it is possible to manufacture the external connection terminal 103 in which the first terminal layer 350, the second terminal layer 410, and the third terminal layer 310 are laminated in that order during a process for manufacturing the organic EL element 30 using the first conductive film 35LY which is the same as the reflective electrode 35 in the first terminal layer 350, the second conductive film 41LY which is the same as the contact electrode 41 in the second terminal layer 410, and the third conductive film 31LY which is the same as the pixel electrode 31 in the third terminal layer 310.

Organic EL Apparatus Manufacturing Method

In detail, the manufacturing method of the organic EL apparatus 100 of the embodiment will be described with reference to FIGS. 9A to 9E. Here, FIGS. 9A to 9E are sectional views for describing a process for manufacturing the organic EL element 30 (30R is exemplified in the embodiment) and the external connection terminal 103 as a manufacturing method of the organic EL apparatus 100. In addition, one pixel 20 (20R is exemplified in the embodiment) in the display region E is illustrated on the right side in FIGS. 9A to 9E, and one external connection terminal 103 in the peripheral region F is illustrated on the left side in FIGS. 9A to 9E.

In the embodiment, it is possible to manufacture the external connection terminal 103 in which the first terminal layer 350, the second terminal layer 410, and the third terminal layer 310 are laminated in that order during the process for manufacturing the organic EL element 30.

Figure 9A:
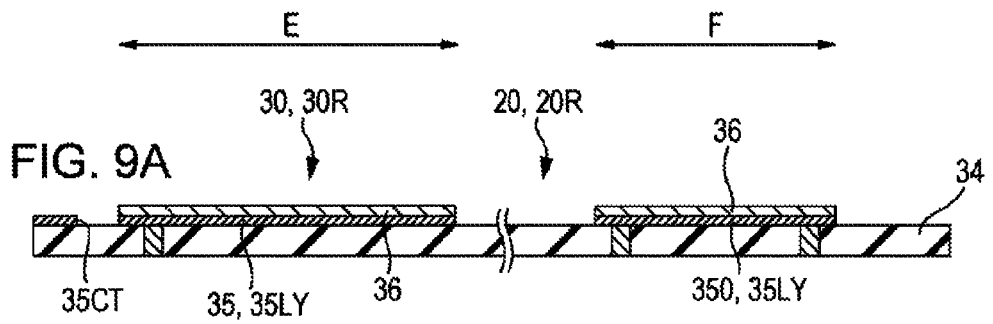
FIGS. 9A to 9E are sectional views for describing a manufacturing process of the organic EL apparatus which is illustrated in FIG. 1.

In detail, as shown in FIG. 9A, in the manufacturing method of the embodiment, first a Ti/AlCu film (the first conductive film 35LY) and an SiO$_2$ film (the reflection enhancing layer 36) are laminated in that order on the surface of the interlayer insulation layer 34, then thereon a mask layer (not shown in the drawings) is formed in a shape which corresponds to the reflective electrode 35 and the first terminal layer 350 using a photolithography technique. Then, the Ti/AlCu film and the SiO$_2$ film are etched until the surface of the interlayer insulation layer 34 is exposed, then the mask layer is removed. Thereby, it is possible to carry out patterning on the Ti/AlCu film and the SiO$_2$ film in a shape which corresponds to the reflective electrode 35 and the first terminal layer 350.

Figure 9B:
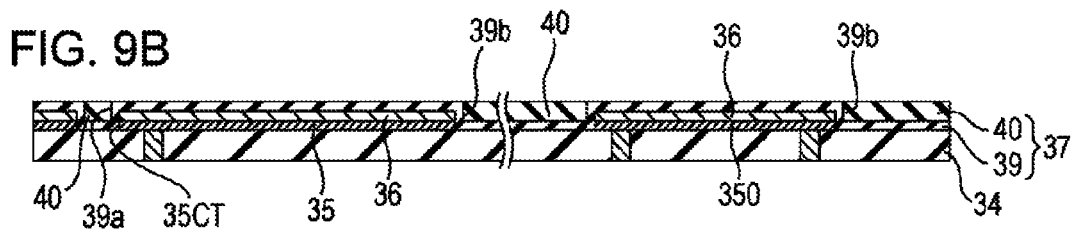

Next, as shown in FIG. 9B, thereupon an SiN film (the first insulation film 39) is formed, and the SiO$_2$ film (embedded insulation film 40) is formed so as to be embedded in concave sections 39a and 39b which are formed in the first insulation film 39. Thereby, the protective layer 37, on which the upper surface is flattened, is formed.

Figure 9C:
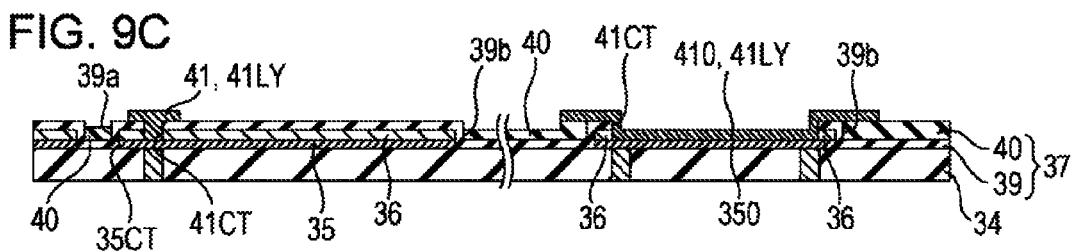

Next as shown in FIG. 9C, the contact hole 41CT is formed on the reflective electrode 35 and the first contact hole 410CT is formed on the first terminal layer 350 so as to pass through the reflection enhancing layer 36 and the protective layer 37. After this, the TiN film (second conductive film 41YL) which covers the surface of the protective layer 37 is formed in a state of being embedded in the contact holes 41CT and 410CT. After this, thereupon, a mask layer (not shown in the drawings) with a shape which corresponds to the second contact electrode 41 and the second terminal layer 410 is formed using a photolithography technique. Then, the TiN film is etched until the surface of the protective layer 37 is exposed, then the mask layer is removed. Thereby, it is possible to carry out patterning on the TiN film in a shape which corresponds to the second contact electrode 41 and the second terminal layer 410.

Figure 9D:
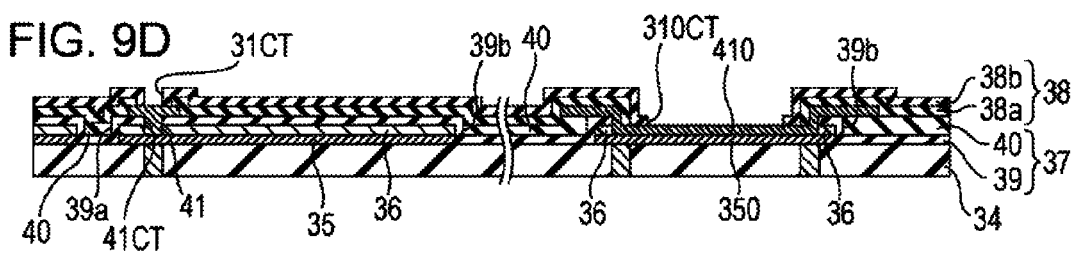

Next, as shown in FIG. 9D, thereupon, the optical path adjustment layer 38 is formed by laminating the insulation films 38a and 38b in that order. After this, the contact hole 31CT is formed on the second contact electrode 41 and the second contact hole 310CT is formed on the second terminal layer 410 so as to pass through the optical path adjustment layer 38.

Figure 9E:
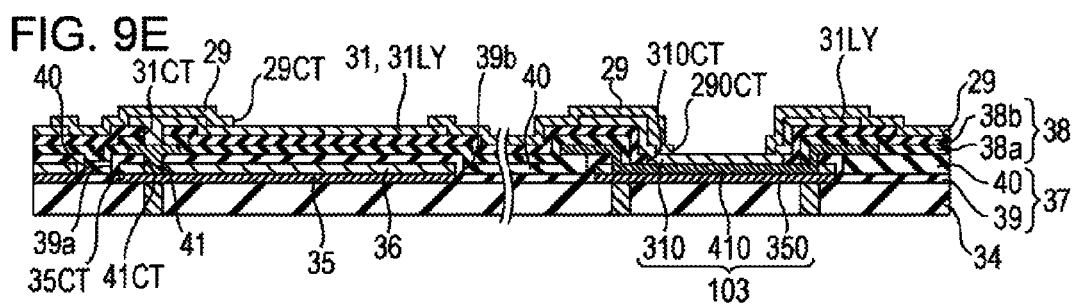

Next, as shown in FIG. 9E, an ITO film (the third conductive film 31LY) which covers the surface of the optical path adjustment layer 38 is formed in a state of being embedded in the contact holes 31CT and 310CT. After this, thereupon, a mask layer (not shown in the drawings) with a shape which corresponds to the pixel electrode 31 and the third terminal layer 310 is formed using a photolithography technique. Then, the ITO film is etched until the surface of the optical path adjustment layer 38 is exposed, then the mask layer is removed. Thereby, it is possible to carry out patterning on the ITO film in a shape which corresponds to the pixel electrode 31 and the third terminal layer 310. After this, a SiO$_2$ film (the pixel separation layer 29) is formed, then the opening 29CT is formed on the pixel electrode 31, and the terminal opening section 290CT is formed on the third terminal layer 310.

In the manner above, in the manufacturing method of the embodiment, it is possible to manufacture the external connection terminal 103 in which the first terminal layer 350, the second terminal layer 410, and the third terminal layer 310 are laminated in that order during a process for manufacturing the organic EL element 30 using the first conductive film 35LY which is the same as the reflective electrode 35 in the first terminal layer 350, the second conductive film 41LY which is the same as the second contact electrode 41 in the second terminal layer 410, and the third conductive film 31LY which is the same as the pixel electrode 31 in the third terminal layer 310.

In addition, in the manufacturing method of the embodiment, it is possible to further reduce the resistance value of the external connection terminal 103 than in a case where the first terminal layer 350 (first conductive film 35LY) and the third terminal layer 310 (third conductive film 31LY) are directly laminated by providing the second terminal layer 410 (second conductive film 41LY) between the first terminal layer 350 (first conductive film 35LY) and the third terminal layer 310 (third conductive film 31LY). In addition, since the reflective electrode 35 is formed using the first conductive film 35LY, it is possible to prevent a reduction in reflectivity of the reflective electrode 35.

In addition, the organic EL apparatus 100 of the embodiment is configured such that the transistor 124 and the reflective electrode 35 are electrically connected via the first contact electrode 28 which is described above, and the reflective electrode 35 and the pixel electrode 31 are electrically connected via the second contact electrode 41. That is, the pixel electrode 31 is electrically connected to the transistor 124 via the reflective electrode 35.

Thereby, in the organic EL apparatus 100 of the embodiment, a case where a portion of a power supply line configures the reflective electrode, and a case where the power supply line and the reflective electrode are electrically connected are different, and the reflective electrode 35 and the pixel electrode 31 have the same potential due to the reflective electrode 35 and the pixel electrode 31 being electrically connected. Thereby, it is possible to achieve a further improvement in yield since it is possible to avoid a short between the power supply line and the pixel electrode, which is generated by a defect or the like in the insulation layer between the reflective electrode 35 and the pixel electrode 31 (the reflection enhancing layer 36, the protective layer 37, the optical path adjustment layer 38, and the like).

In addition, in the organic EL apparatus 100 of the embodiment, by such a configuration, it is possible to perform the light-emitting operation of the organic EL element 30 with high reliability while controlling the potential which is applied from the transistor 124 to the pixel electrode 31 via the reflective electrode 35.

In addition, in the organic EL apparatus 100 of the embodiment, the contact electrode 41 which is described above has the first contact section 41a which is connected to the reflective electrode 35 in a state of being embedded in the contact hole 41CT, and the second contact section 41b which is connected to the pixel electrode 31 in a state of covering the surface of the optical path adjustment layer 38. In this case, it is possible to effectively connect the reflective electrode 35 and the pixel electrode 31 via the second contact electrode 41.

Furthermore, in the organic EL apparatus 100 of the embodiment, the second contact section 41b functions as an etching stopper for the optical path adjustment layer 38 and it is possible to increase the aperture ratio of each pixel 20 when patterning is carried out on the optical path adjustment layer 38 in a predetermined shape by an end section of at least a portion of the optical path adjustment layer 38 which is described above being positioned on the surface of the second contact section 41b. In addition, in the external connection terminal 103, it is possible for the second terminal layer 410 to function as an etching stopper for the optical path adjustment layer 38.

Here, in the organic EL apparatus 100 of the embodiment, since the surface of the protective layer 37 which is described above on the side which comes in contact with the optical path adjustment layer 38 is flattened, it is possible to accurately perform optical path adjustment between the reflective electrode 35 and the pixel electrode 31 by adjusting the thickness of the optical path adjustment layer 38 in each pixel 20. Thereby, it is possible to perform the light-emitting operation for the organic EL element 30 with good color reproducibility using the resonant structure which is described above. In addition, in the external connection terminal 103 a step due to the first terminal layer 350 or the like is flattened using the protective layer 37. Accordingly, it is possible to flatten a region in which a plurality of external connection terminals 103 are provided, and it is possible to reliably perform connection to an external circuit.

In addition, in the organic EL apparatus 100 of the embodiment, the end section of the pixel electrode 31 which is disposed on the surface of the optical path adjustment layer 38 is able to be positioned further outside than a position at which the concave section 39a is formed since the optical path adjustment layer 38, which is disposed on the surface of the protective layer 37 which is described above, is also flattened. Thereby, it is possible to increase the aperture ratio of the pixels 20, that is, the aperture area (light-emitting area) of the opening 29CT which specifies the light-emitting region of the pixels 20 which is described above.

In addition, in the organic EL apparatus 100 of the embodiment, an end section of at least a portion of the optical path adjustment layer 38 (insulation films 38a and 38b) is disposed so as to be positioned on the surface of the first insulation film 39 which is described above. Meanwhile, a silicon oxide ($SiO_2$) film is used in the optical path adjustment layer 38 (insulation films 38a and 38b) and the embedded insulation film 40, and a silicon nitride (SiN) film with an etching rate lower than the silicon oxide ($SiO_2$) film is used in the first insulation film 39.

In this case, it is possible to selectively etch silicon oxide with respect to silicon nitride by, for example, dry etching using fluorine-based gas. Accordingly, it is possible for the first insulation film 39 to function as an etching stopper for the optical path adjustment layer 38 while protecting the embedded insulation film 40 when patterning is carried out on the optical path adjustment layer 38 in a predetermined shape.

Modification Example

Figure 10:
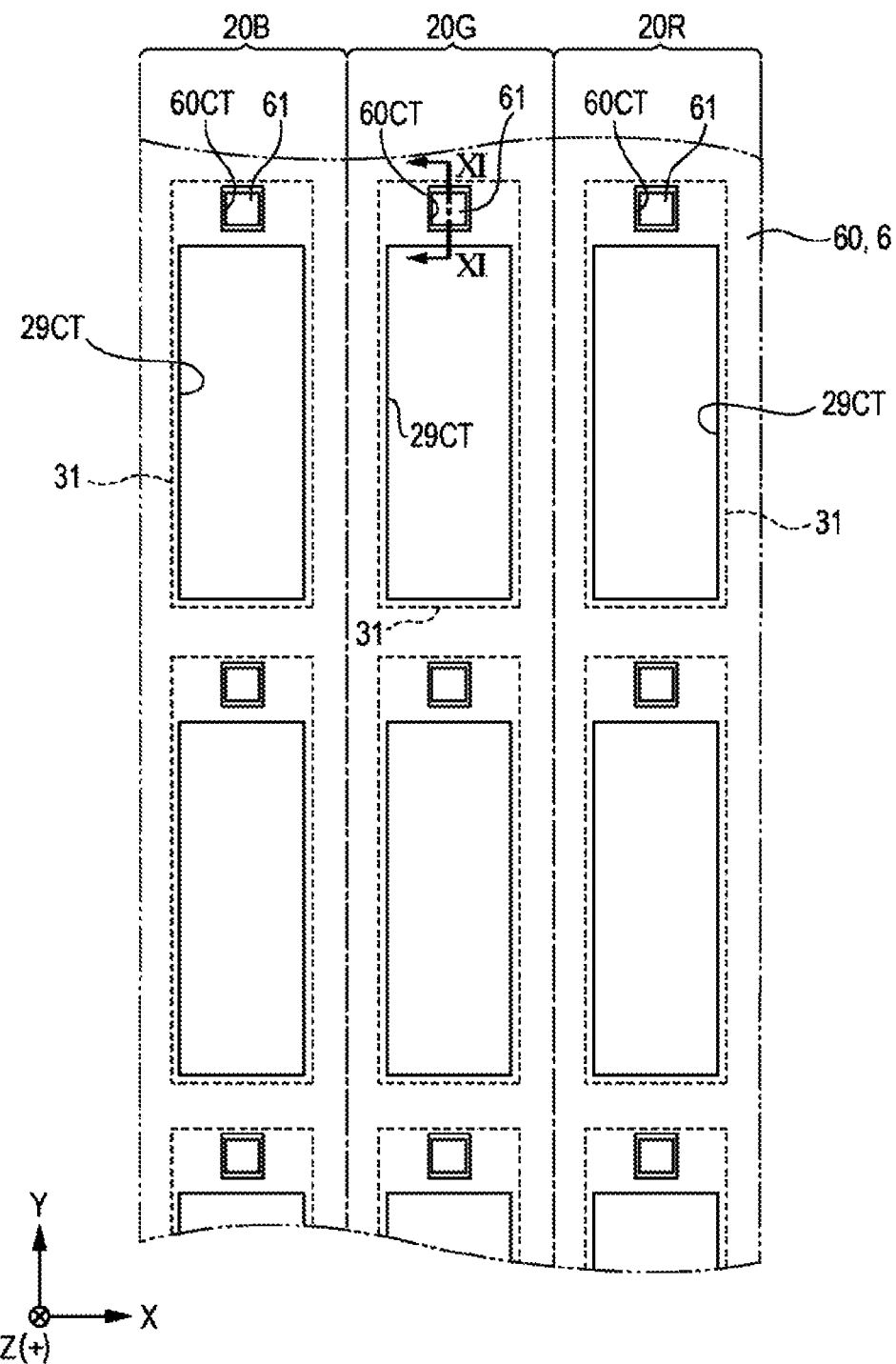
Figure 11:
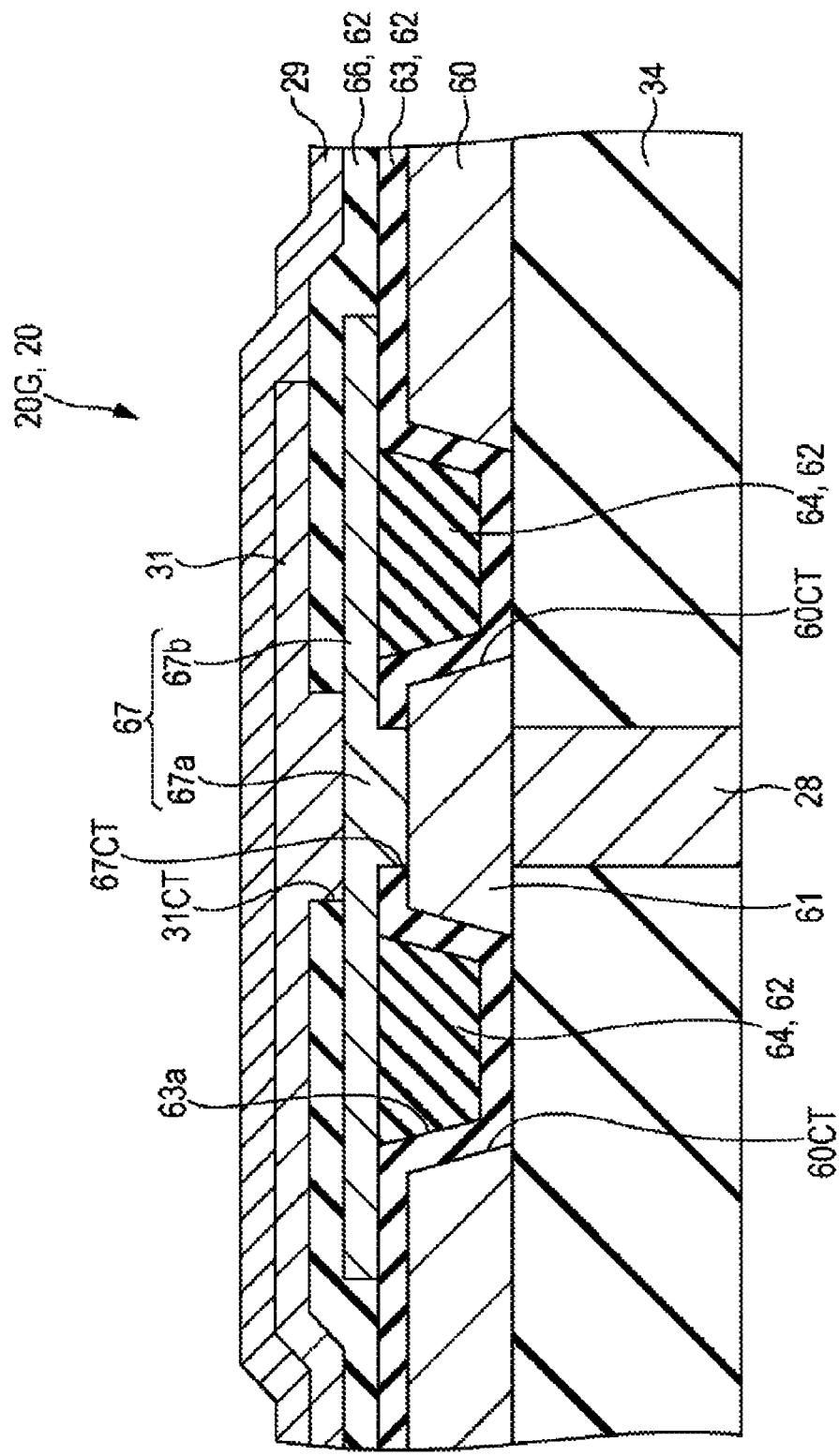
FIG. 11 is a sectional view using a line segment XI-XI which is illustrated in FIG. 10.

Next, an organic EL apparatus 200 which is illustrated in FIGS. 10 and 11 will be described as a modification example of the organic EL apparatus 100. Here, FIG. 10 is a planar view illustrating a configuration of the pixels 20 (pixels 20B, 20G, and 20R). FIG. 11 is a sectional view of the pixel 20G using the line segment XI-XI which is illustrated in FIG. 10. In addition, in the description below, the parts which are the same as the organic EL apparatus 100 described above will be omitted from the description and given the same reference numerals in the drawings.

As shown in FIGS. 10 and 11, the organic EL apparatus 200 is provided with a reflective electrode 60 which is configured by a portion of the power supply line 6 in place of the reflective electrode 35 which is disposed so as to be split into each pixel 20. That is, the reflective electrode 60 is disposed in common to each of the pixels 20B, 20G, and 20R.

In addition, as shown in FIG. 3, in the power supply line 6, a source of the transistor 121 and an end of the capacitor 21 are connected. Accordingly, the reflective electrode 60 reflects light from the light-emitting function layer 32 side, and fulfills the role of supplying the potential Vel which is the highest potential power source to the pixel circuit 110. In the same manner as the first contact electrode 28, a contact electrode is provided in the interlayer insulation layer (insulation layer) 34.

In addition, the organic EL apparatus 200 is provided with a relay electrode 61 which is electrically connected to the first contact electrode 28. An opening 60CT with a rectangular shape in planar view is formed in each pixel 20. The contact hole 60CT is a hole section through which the reflective electrode 60 passes through, and the relay electrode 61 is disposed inside the opening 60CT.

In the embodiment, for example, a film alloy of aluminum (Al) and copper (Cu) (AlCu) with a film thickness of 100 nm is formed on a titanium (Ti) film with a film thickness of 30 nm as the reflective electrode 60 and the relay electrode 61.

In addition, the reflection enhancing layer 36 is omitted in the organic EL apparatus 200, and the organic EL apparatus 200 is provided with an optical adjustment layer 62 in place of the protective layer 37 and the optical path adjustment layer 38. The optical adjustment layer 62 covers the surface of the reflective electrode 60 on which the opening 60CT is formed, and has a first insulation film 63 which has a concave section 63a that is formed inside the opening 60CT, an embedded insulation film 64 which is embedded in the concave section 63a, and a second insulation film 66 which is disposed on the surface of the first insulation film 63.

In addition, the organic EL apparatus 200 is provided with a second contact electrode 67 which is electrically connected to the pixel electrode 31 in place of the second contact electrode 41. The second contact electrode 67 has a first contact section 67a which is connected to the relay electrode 61, and a second contact electrode 67b which is connected to the pixel electrode 31. The contact hole 67CT is a hole section through which the first insulation film 63 passes, and the first contact section 67a is formed so as to be embedded in the contact hole 67CT. The second contact section 67b is disposed on the surface of the second insulation film 66.

In the optical adjustment layer 62, the first insulation film 63 and the embedded insulation film 64 function as the protective layer. In addition, the second insulation film 66 functions as the optical path adjustment layer.

The second insulation film 66 is disposed so as to cover the first insulation film 63 and surface of the second contact section 67b. The pixel electrode 31 is connected to the contact electrode 67 (second contact section 67b) via the contact hole 31CT which is formed on the second insulation film 66.

Here, in the embodiment, a silicon nitride (SiN) film is formed as the first insulation film 63, and a silicon oxide (SiO$_2$) film is formed as the embedded insulation film 64 and the second insulation film 66.

In addition, the film thickness of the optical adjustment layer 62 becomes larger in order of the pixel 20B, the pixel 20G, and the pixel 20R. That is, in the pixel 20B, the first insulation film 63 is provided such that, for example, the resonant wavelength (peak wavelength where luminance is maximum) is 470 nm. In the pixel 20G, the first insulation film 63 and the second insulation film 66 are provided such that, for example, the resonant wavelength is 540 nm. In the pixel 20R, the first insulation film 63, the second insulation film 66, and a third insulation film (not shown in the drawings) are provided such that, for example, the resonant wavelength is 610 nm.

Here, in the embodiment, the reflection enhancing layer 36 is omitted, but there may be a configuration in which the reflection enhancing layer 36 is provided between the first insulation film 63 and the reflective electrode 60.

In the organic EL apparatus 200 which has the configuration as above, the transistor 124 and the pixel electrode 31 are electrically connected via the relay electrode 61 and the contact electrode 67. In addition, the contact electrode 67 is provided so as to cover the relay electrode 61 and the opening 60CT. Then, the contact electrode 67 is provided so as to overlap with at least a portion of the reflective electrode 60 in planar view. Then, the contact electrode 67 has a light-shielding property. According to this configuration, it is possible to improve display quality by light which is incident from the opening 60CT being shielded by the contact electrode 67. Here, in the embodiment, for example, a titanium nitride (TiN) film with a thickness of 500 nm is formed as the contact electrode 67.

In the organic EL apparatus 200 of the embodiment, in the same manner as the organic EL apparatus 100 which is described above, it is possible to manufacture the external connection terminal 103 in which the first terminal layer 350, the second terminal layer 410, and the third terminal layer 310 are laminated in that order during a process for manufacturing the organic EL element 30 using the first conductive film 35LY which is the same as the reflective electrode 35 in the first terminal layer 350, the second conductive film 41LY which is the same as the contact electrode 67 in the second terminal layer 410, and the third conductive film 31LY which is the same as the pixel electrode 31 in the third terminal layer 310.

Accordingly, in the organic EL apparatus 200 of the embodiment, in the same manner as the organic EL apparatus 100 which is described above, it is possible to further reduce the resistance value of the external connection terminal 103 than in a case where the first terminal layer 350 (first conductive film 35LY) and the third terminal layer 310 (third conductive film 31LY) are directly laminated, by forming the second terminal layer 410 (second conductive film 41LY) between the first terminal layer 350 (first conductive film 35LY) and the third terminal layer 310 (third conductive film 31LY). In addition, since the reflective electrode 35 is formed using the first conductive film 35LY, it is possible to prevent a reduction in reflectivity of the reflective electrode 35.

Here, although the description is omitted, the manufacturing method of the organic EL apparatus 200 of the embodiment is able to obtain the same effects using the same method as the manufacturing method of the organic EL apparatus 100 which is described above.

That is, it is possible to manufacture the external connection terminal 103 in which the first terminal layer 350, the second terminal layer 410, and the third terminal layer 310 are laminated in that order during a process for manufacturing the organic EL element 30 using the first conductive film 35LY which is the same as the reflective electrode 35 in the first terminal layer 350, the second conductive film 41LY which is the same as the second contact electrode 67 in the second terminal layer 410, and the third conductive film 31LY which is the same as the pixel electrode 31 in the third terminal layer 310.

In addition, it is possible to further reduce the resistance value of the external connection terminal 103 than in a case where the first terminal layer 350 (first conductive film 35LY) and the third terminal layer 310 (third conductive film 31LY) are directly laminated, by providing the second terminal layer 410 (second conductive film 41LY) between the first terminal layer 350 (first conductive film 35LY) and the third terminal layer 310 (third conductive film 31LY). In addition, since the reflective electrode 35 is formed using the first conductive film 35LY, it is possible to prevent a reduction in reflectivity of the reflective electrode 35.

Electronic Device

Figure 12:
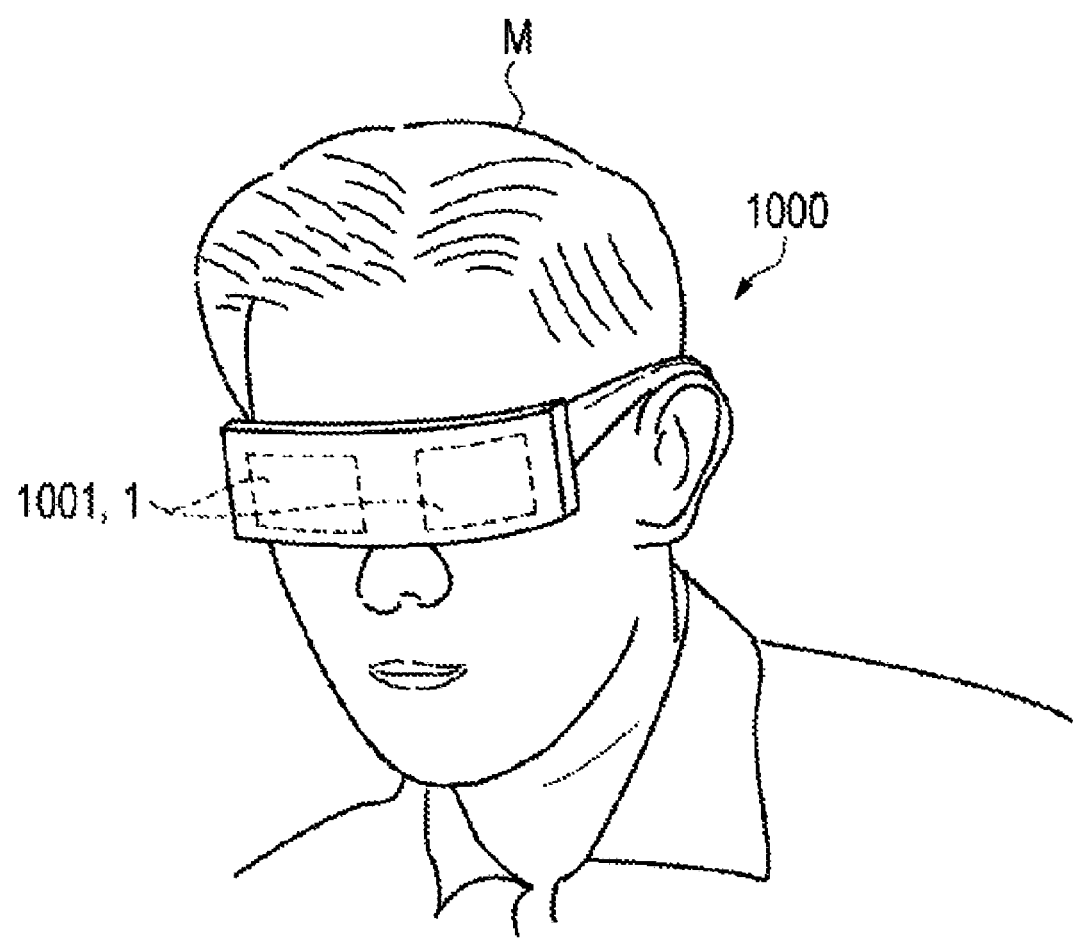
FIG. 12 is a schematic view illustrating an example of an electronic device which is provided with the organic EL apparatus.

Next, a head-mounted display 1000 which is illustrated in FIG. 12 is described as an example of an electronic device which is provided with the organic EL apparatuses 100 and 200. Here, FIG. 12 is a schematic diagram illustrating a configuration of the head-mounted display 1000.

As shown in FIG. 12, the head-mounted display 1000 has two display sections 1001 which are provided to correspond to left and right eyes. An observer M is able to see characters, images, and the like which are displayed on the display sections 1001 by mounting the head-mounted display 1000 on their head as glasses. For example, if an image is displayed taking into account a parallax in the left and right display sections 1001, it is also possible to enjoy viewing three-dimensional moving images.

The organic EL apparatuses 100 and 200 are used in the display sections 1001. In the organic EL apparatuses 100 and 200, it is possible to reduce the resistance value of the external connection terminal 103 while preventing a reduction of reflectivity of the reflective electrode 35 which is described above. Accordingly, it is possible to prevent generation of point defects and provide the head-mounted display 1000 with a high-quality display by mounting the organic EL apparatuses 100 and 200 in the display sections 1001.

Here, the invention is not necessarily limited to the embodiments described above, and it is possible to add various modifications without deviating from the gist of the invention.

In detail, the electro-optical apparatus to which the invention is applied is not limited to an organic EL apparatus which is provided with the organic EL element as the light-emitting element which is described above, and it is possible to widely apply the invention to, for example, an electro-optical apparatus which is provided with a self-luminous light-emitting element such as an inorganic EL element or an LED.

In addition, the electronic device to which the present invention is applied is not limited to the head-mounted display 1000 which is described above, and it is possible, for example, to give the example of an electronic device which uses the electro-optical apparatus to which the invention is applied in a head-up display, an electronic viewfinder of a digital camera, a portable information terminal, and a display section such as a navigator.

The entire disclosure of Japanese Patent Application No.: 2014-262959, filed Dec. 25, 2014 is expressly incorporated by reference herein.

What is claimed is:

1. A manufacturing method of an electro-optical apparatus having a structure that includes a display region in which a plurality of light-emitting elements are arranged in a matrix form, and a peripheral region in which a terminal is disposed outside the display region, the light-emitting element has a structure in which a reflective electrode, an optical path adjustment layer, a first electrode, a light-emitting layer, and a second electrode are laminated and the first electrode is electrically connected to a contact electrode, and the terminal is laminated with a first terminal layer, a second terminal layer, and a third terminal layer, the method comprising:

forming the reflective electrode in the display region, and forming the first terminal layer in the peripheral region by forming a first conductive film, and patterning the first conductive film;

after the forming of the reflective electrode in the display region, forming the contact electrode in the display region, and laminating the second terminal layer on the first terminal layer in the peripheral region by forming a second conductive film, and patterning the second conductive film; and after the forming of the contact electrode in the display region, forming the first electrode in the display region, and laminating the third terminal layer on the second terminal layer in the peripheral region by forming a third conductive film, and patterning the third conductive film.

2. The manufacturing method of the electro-optical apparatus according to claim 1, wherein the third conductive film includes a transparent conductive material, the second conductive film includes a conductive material with a higher conductivity than the third conductive film, and the first conductive film includes a reflective conductive material.

3. The manufacturing method of the electro-optical apparatus according to claim 2, wherein the third conductive film includes indium tin oxide, the second conductive film includes titanium nitride, and the first conductive film includes aluminum and copper.

* * * * *